United States Patent
Ramaswamy et al.

(10) Patent No.: US 9,117,998 B2
(45) Date of Patent: *Aug. 25, 2015

(54) NONVOLATILE MEMORY CELLS AND METHODS OF FORMING NONVOLATILE MEMORY CELLS

(71) Applicant: Micron Technology, Inc., Boise, ID (US)

(72) Inventors: D. V. Nirmal Ramaswamy, Boise, ID (US); Gurtej S. Sandhu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/319,290

(22) Filed: Jun. 30, 2014

(65) Prior Publication Data

US 2014/0312291 A1    Oct. 23, 2014

Related U.S. Application Data

(63) Continuation of application No. 12/917,348, filed on Nov. 1, 2010, now Pat. No. 8,796,661.

(51) Int. Cl.
    *H01L 45/00*    (2006.01)
(52) U.S. Cl.
    CPC .............. *H01L 45/085* (2013.01); *H01L 45/04* (2013.01); *H01L 45/08* (2013.01); *H01L 45/1233* (2013.01); *H01L 45/1266* (2013.01); *H01L 45/1273* (2013.01); *H01L 45/14* (2013.01); *H01L 45/142* (2013.01);

(Continued)

(58) Field of Classification Search
    USPC ........................................................ 257/2–5
    See application file for complete search history.

(56) References Cited

U.S. PATENT DOCUMENTS

| 4,715,685 A | 12/1987 | Yaniv et al. |
| 4,964,080 A | 10/1990 | Tzeng |

(Continued)

FOREIGN PATENT DOCUMENTS

| CN | 1444284 | 9/2003 |
| CN | 1459792 | 12/2003 |

(Continued)

OTHER PUBLICATIONS

U.S. Appl. No. 12/014,232, filed Jan. 15, 2008, Liu.

(Continued)

*Primary Examiner* — Khaja Ahmad
(74) *Attorney, Agent, or Firm* — Wells St. John, P.S.

(57) ABSTRACT

A method of forming a nonvolatile memory cell includes forming a first electrode having a first current conductive material and a circumferentially self-aligned second current conductive material projecting elevationally outward from the first current conductive material. The second current conductive material is different in composition from the first current conductive material. A programmable region is formed over the first current conductive material and over the projecting second current conductive material of the first electrode. A second electrode is formed over the programmable region. In one embodiment, the programmable region is ion conductive material, and at least one of the first and second electrodes has an electrochemically active surface directly against the ion conductive material. Other method and structural aspects are disclosed.

10 Claims, 7 Drawing Sheets

(52) U.S. Cl.
CPC ............ *H01L 45/143* (2013.01); *H01L 45/144* (2013.01); *H01L 45/146* (2013.01); *H01L 45/147* (2013.01); *H01L 45/1683* (2013.01)

(56) References Cited

U.S. PATENT DOCUMENTS

| | | |
|---|---|---|
| 5,049,970 A | 9/1991 | Tanaka et al. |
| 5,122,476 A | 6/1992 | Fazan et al. |
| 6,218,696 B1 | 4/2001 | Radius |
| 6,432,767 B2 | 8/2002 | Torli et al. |
| 6,524,867 B2 | 2/2003 | Yang et al. |
| 6,552,952 B2 | 4/2003 | Pascucci |
| 6,687,147 B2 | 2/2004 | Fricke et al. |
| 6,693,821 B2 | 2/2004 | Hsu et al. |
| 6,693,846 B2 | 2/2004 | Fibranz |
| 6,717,881 B2 | 4/2004 | Ooishi |
| 6,753,561 B1 | 6/2004 | Rinerson et al. |
| 6,753,562 B1 | 6/2004 | Hsu et al. |
| 6,757,188 B2 | 6/2004 | Perner et al. |
| 6,778,421 B2 | 8/2004 | Tran |
| 6,785,159 B2 | 8/2004 | Tuttle |
| 6,806,531 B1 | 10/2004 | Chen et al. |
| 6,834,008 B2 | 12/2004 | Rinerson et al. |
| 6,873,544 B2 | 3/2005 | Perner et al. |
| 6,905,937 B2 | 6/2005 | Hsu et al. |
| 6,930,324 B2 | 8/2005 | Kowalski et al. |
| 6,940,113 B2 | 9/2005 | Hsu et al. |
| 6,946,702 B2 | 9/2005 | Jang |
| 6,950,369 B2 | 9/2005 | Kunikiyo et al. |
| 6,955,992 B2 | 10/2005 | Zhang et al. |
| 6,958,273 B2 | 10/2005 | Chen et al. |
| 6,961,258 B2 | 11/2005 | Lowrey |
| 6,970,375 B2 | 11/2005 | Rinerson et al. |
| 6,972,211 B2 | 12/2005 | Hsu et al. |
| 6,985,374 B2 | 1/2006 | Yamamura |
| 7,002,197 B2 | 2/2006 | Perner et al. |
| 7,005,350 B2 | 2/2006 | Walker et al. |
| 7,009,278 B2 | 3/2006 | Hsu |
| 7,026,911 B2 | 4/2006 | Aono et al. |
| 7,029,924 B2 | 4/2006 | Hsu et al. |
| 7,029,925 B2 | 4/2006 | Celii et al. |
| 7,035,141 B1 | 4/2006 | Tripsas et al. |
| 7,050,316 B1 | 5/2006 | Lin et al. |
| 7,067,862 B2 | 6/2006 | Rinerson et al. |
| 7,085,167 B2 | 8/2006 | Lee et al. |
| 7,109,544 B2 | 9/2006 | Schoelesser et al. |
| 7,123,535 B2 | 10/2006 | Kurotsuchi et al. |
| 7,149,108 B2 | 12/2006 | Rinerson et al. |
| 7,167,387 B2 | 1/2007 | Sugita et al. |
| 7,180,160 B2 | 2/2007 | Ferrant et al. |
| 7,187,201 B1 | 3/2007 | Trimberger |
| 7,193,267 B2 | 3/2007 | Hsu et al. |
| 7,205,238 B2 | 4/2007 | Pan et al. |
| 7,233,024 B2 | 6/2007 | Scheuerlein et al. |
| 7,236,389 B2 | 6/2007 | Hsu |
| 7,247,876 B2 | 7/2007 | Lowrey |
| 7,273,791 B2 | 9/2007 | Basceri et al. |
| 7,323,349 B2 | 1/2008 | Hsu et al. |
| 7,388,775 B2 | 6/2008 | Bedeschi et al. |
| 7,393,785 B2 | 7/2008 | Uhlenbrock et al. |
| 7,405,967 B2 | 7/2008 | Kozicki et al. |
| 7,459,715 B2 | 12/2008 | Toda et al. |
| 7,465,675 B2 | 12/2008 | Koh |
| 7,473,982 B2 | 1/2009 | Aono et al. |
| 7,489,552 B2 | 2/2009 | Kurotsuchi et al. |
| 7,525,410 B2 | 4/2009 | Aono et al. |
| 7,538,338 B2 | 5/2009 | Rinerson et al. |
| 7,544,987 B2 | 6/2009 | Lu et al. |
| 7,557,424 B2 | 7/2009 | Wong et al. |
| 7,560,815 B1 | 7/2009 | Vaartstra et al. |
| 7,570,511 B2 | 8/2009 | Cho et al. |
| 7,639,523 B2 | 12/2009 | Celinska et al. |
| 7,666,526 B2 | 2/2010 | Chen et al. |
| 7,671,417 B2 | 3/2010 | Yoshida et al. |
| 7,679,812 B2 | 3/2010 | Sasagawa et al. |
| 7,687,793 B2 | 3/2010 | Harshfield et al. |
| 7,687,840 B2 | 3/2010 | Shinmura |
| 7,696,077 B2 | 4/2010 | Liu |
| 7,700,935 B2 | 4/2010 | Kim et al. |
| 7,727,908 B2 | 6/2010 | Ahn et al. |
| 7,751,163 B2 | 7/2010 | Duch et al. |
| 7,755,076 B2 | 7/2010 | Lung |
| 7,768,812 B2 | 8/2010 | Liu |
| 7,772,580 B2 | 8/2010 | Hofmann et al. |
| 7,777,215 B2 | 8/2010 | Chien et al. |
| 7,799,672 B2 | 9/2010 | Hashimoto et al. |
| 7,838,861 B2 | 11/2010 | Klostermann |
| 7,842,991 B2 | 11/2010 | Cho et al. |
| 7,864,568 B2 | 1/2011 | Fujisaki et al. |
| 7,898,839 B2 | 3/2011 | Aoki |
| 7,907,436 B2 | 3/2011 | Maejima et al. |
| 7,910,909 B2 | 3/2011 | Kim et al. |
| 7,948,784 B2 | 5/2011 | Kajigaya |
| 7,990,754 B2 | 8/2011 | Azuma et al. |
| 8,021,897 B2 | 9/2011 | Sills et al. |
| 8,043,926 B2 | 10/2011 | Cho et al. |
| 8,048,755 B2 | 11/2011 | Sandhu et al. |
| 8,094,477 B2 | 1/2012 | Maejima |
| 8,098,520 B2 | 1/2012 | Seigler et al. |
| 8,106,375 B2 | 1/2012 | Chen et al. |
| 8,124,968 B2 | 2/2012 | Koo et al. |
| 8,154,908 B2 | 4/2012 | Maejima et al. |
| 8,154,909 B2 | 4/2012 | Azuma et al. |
| 8,295,077 B2 | 10/2012 | Murooka |
| 8,355,274 B2 | 1/2013 | Arita et al. |
| 8,411,477 B2 | 4/2013 | Tang et al. |
| 8,436,414 B2 | 5/2013 | Tanaka et al. |
| 8,536,556 B2 | 9/2013 | Fukumizu |
| 8,537,592 B2 | 9/2013 | Liu |
| 8,542,513 B2 | 9/2013 | Tang et al. |
| 8,611,121 B2 | 12/2013 | Ahn et al. |
| 8,652,909 B2 | 2/2014 | Sills et al. |
| 8,791,447 B2 | 7/2014 | Liu et al. |
| 8,854,863 B2 | 10/2014 | Liu |
| 2002/0018355 A1 | 2/2002 | Johnson et al. |
| 2002/0034117 A1 | 3/2002 | Okazawa |
| 2002/0079524 A1 | 6/2002 | Dennison |
| 2002/0196695 A1 | 12/2002 | Pascucci |
| 2003/0031047 A1 | 2/2003 | Anthony et al. |
| 2003/0174042 A1 | 9/2003 | Aono et al. |
| 2003/0174570 A1 | 9/2003 | Ooishi |
| 2003/0218902 A1 | 11/2003 | Perner et al. |
| 2003/0218929 A1 | 11/2003 | Fibranz |
| 2003/0223283 A1 | 12/2003 | Kunikiyo |
| 2004/0002186 A1 | 1/2004 | Vyvoda et al. |
| 2004/0090841 A1 | 5/2004 | Perner et al. |
| 2004/0100835 A1 | 5/2004 | Sugibayashi et al. |
| 2004/0108528 A1 | 6/2004 | Hsu et al. |
| 2004/0124407 A1 | 7/2004 | Kozicki et al. |
| 2004/0245547 A1 | 12/2004 | Stipe |
| 2005/0001257 A1 | 1/2005 | Schoelesser et al. |
| 2005/0014325 A1 | 1/2005 | Aono et al. |
| 2005/0032100 A1 | 2/2005 | Heath et al. |
| 2005/0054119 A1 | 3/2005 | Hsu et al. |
| 2005/0128799 A1 | 6/2005 | Kurotsuchi et al. |
| 2005/0161747 A1 | 7/2005 | Lung et al. |
| 2005/0174835 A1 | 8/2005 | Rinerson et al. |
| 2005/0205943 A1 | 9/2005 | Yamada |
| 2005/0243844 A1 | 11/2005 | Aono et al. |
| 2005/0250281 A1 | 11/2005 | Ufert et al. |
| 2005/0269646 A1 | 12/2005 | Yamada |
| 2005/0287741 A1 | 12/2005 | Ding |
| 2006/0035451 A1 | 2/2006 | Hsu |
| 2006/0046509 A1 | 3/2006 | Gwan-Hyeob |
| 2006/0062049 A1 | 3/2006 | Lee et al. |
| 2006/0097238 A1 | 5/2006 | Breuil et al. |
| 2006/0099813 A1 | 5/2006 | Pan et al. |
| 2006/0104111 A1 | 5/2006 | Tripsas et al. |
| 2006/0110878 A1 | 5/2006 | Lung et al. |
| 2006/0160304 A1 | 7/2006 | Hsu et al. |
| 2006/0170027 A1 | 8/2006 | Lee et al. |
| 2006/0171200 A1 | 8/2006 | Rinerson et al. |
| 2006/0181920 A1 | 8/2006 | Ufert |
| 2006/0215445 A1 | 9/2006 | Baek et al. |

(56) References Cited

U.S. PATENT DOCUMENTS

| | | |
|---|---|---|
| 2006/0258079 A1 | 11/2006 | Lung et al. |
| 2006/0274593 A1 | 12/2006 | Kurotsuchi et al. |
| 2006/0284242 A1 | 12/2006 | Jo |
| 2006/0286709 A1 | 12/2006 | Lung et al. |
| 2007/0010082 A1 | 1/2007 | Pinnow et al. |
| 2007/0015330 A1 | 1/2007 | Li et al. |
| 2007/0019923 A1 | 1/2007 | Sasagawa et al. |
| 2007/0034848 A1* | 2/2007 | Liu .................................. 257/2 |
| 2007/0041235 A1 | 2/2007 | Inoue |
| 2007/0045615 A1 | 3/2007 | Cho et al. |
| 2007/0048990 A1 | 3/2007 | Zhuang et al. |
| 2007/0086235 A1 | 4/2007 | Kim et al. |
| 2007/0109835 A1 | 5/2007 | Hsu |
| 2007/0120124 A1 | 5/2007 | Chen et al. |
| 2007/0121369 A1 | 5/2007 | Happ |
| 2007/0123039 A1 | 5/2007 | Elkins et al. |
| 2007/0132049 A1 | 6/2007 | Stipe |
| 2007/0165434 A1 | 7/2007 | Lee et al. |
| 2007/0167008 A1 | 7/2007 | Hsu et al. |
| 2007/0173019 A1 | 7/2007 | Ho et al. |
| 2007/0176261 A1 | 8/2007 | Lung |
| 2007/0210348 A1 | 9/2007 | Song et al. |
| 2007/0224770 A1 | 9/2007 | Nagashima |
| 2007/0231988 A1 | 10/2007 | Yoo et al. |
| 2007/0246795 A1 | 10/2007 | Fang et al. |
| 2007/0257257 A1 | 11/2007 | Cho et al. |
| 2007/0258279 A1 | 11/2007 | Lung et al. |
| 2007/0267675 A1 | 11/2007 | Cho et al. |
| 2007/0268739 A1 | 11/2007 | Yoo et al. |
| 2007/0268742 A1 | 11/2007 | Liu |
| 2007/0269683 A1 | 11/2007 | Chen et al. |
| 2007/0278578 A1 | 12/2007 | Yoshida et al. |
| 2007/0285965 A1 | 12/2007 | Toda et al. |
| 2007/0295950 A1 | 12/2007 | Cho et al. |
| 2008/0001172 A1 | 1/2008 | Karg et al. |
| 2008/0008642 A1 | 1/2008 | Mori et al. |
| 2008/0012064 A1 | 1/2008 | Park et al. |
| 2008/0013363 A1 | 1/2008 | Kim et al. |
| 2008/0014750 A1 | 1/2008 | Nagashima |
| 2008/0026547 A1 | 1/2008 | Yin et al. |
| 2008/0029754 A1 | 2/2008 | Min et al. |
| 2008/0029842 A1 | 2/2008 | Symanczyk |
| 2008/0036508 A1 | 2/2008 | Sakamoto et al. |
| 2008/0048165 A1 | 2/2008 | Miyazawa |
| 2008/0049487 A1 | 2/2008 | Yoshimura et al. |
| 2008/0062740 A1 | 3/2008 | Baek et al. |
| 2008/0073635 A1 | 3/2008 | Kiyotoshi et al. |
| 2008/0078985 A1 | 4/2008 | Meyer et al. |
| 2008/0080229 A1 | 4/2008 | Choi et al. |
| 2008/0089105 A1 | 4/2008 | Ro et al. |
| 2008/0093591 A1 | 4/2008 | Khang et al. |
| 2008/0099753 A1 | 5/2008 | Song et al. |
| 2008/0102278 A1 | 5/2008 | Kreupl et al. |
| 2008/0105862 A1 | 5/2008 | Lung et al. |
| 2008/0106925 A1 | 5/2008 | Paz De Araujo et al. |
| 2008/0157257 A1 | 7/2008 | Bertin et al. |
| 2008/0175031 A1 | 7/2008 | Park et al. |
| 2008/0175032 A1 | 7/2008 | Tanaka et al. |
| 2008/0185571 A1 | 8/2008 | Happ et al. |
| 2008/0212361 A1 | 9/2008 | Bertin et al. |
| 2008/0232160 A1 | 9/2008 | Gopalakrishnan |
| 2008/0247219 A1 | 10/2008 | Choi et al. |
| 2008/0251779 A1 | 10/2008 | Kakosehke et al. |
| 2008/0258126 A1 | 10/2008 | Lung |
| 2008/0259672 A1 | 10/2008 | Lung |
| 2008/0303014 A1 | 12/2008 | Goux et al. |
| 2009/0014706 A1 | 1/2009 | Lung |
| 2009/0014707 A1 | 1/2009 | Lu et al. |
| 2009/0026436 A1 | 1/2009 | Song et al. |
| 2009/0057640 A1 | 3/2009 | Lin et al. |
| 2009/0059644 A1 | 3/2009 | Kajigaya et al. |
| 2009/0072217 A1* | 3/2009 | Klostermann .................... 257/4 |
| 2009/0085121 A1 | 4/2009 | Park et al. |
| 2009/0141547 A1 | 6/2009 | Jin et al. |
| 2009/0173930 A1 | 7/2009 | Yasuda et al. |
| 2009/0180309 A1 | 7/2009 | Liu |
| 2009/0207647 A1 | 8/2009 | Maejima et al. |
| 2009/0207681 A1 | 8/2009 | Juengling et al. |
| 2009/0218557 A1 | 9/2009 | Sato |
| 2009/0250681 A1 | 10/2009 | Smythe et al. |
| 2009/0261314 A1 | 10/2009 | Kim et al. |
| 2009/0261343 A1 | 10/2009 | Herner et al. |
| 2009/0267047 A1 | 10/2009 | Sasago et al. |
| 2009/0268532 A1 | 10/2009 | DeAmbroggi et al. |
| 2009/0272959 A1 | 11/2009 | Phatak et al. |
| 2009/0272960 A1 | 11/2009 | Srinivasan et al. |
| 2009/0272961 A1 | 11/2009 | Miller et al. |
| 2009/0272962 A1 | 11/2009 | Kumar et al. |
| 2009/0273087 A1 | 11/2009 | French et al. |
| 2009/0278109 A1 | 11/2009 | Phatak |
| 2009/0303780 A1 | 12/2009 | Kasko et al. |
| 2009/0315090 A1 | 12/2009 | Weis et al. |
| 2009/0316467 A1 | 12/2009 | Liu |
| 2009/0316474 A1 | 12/2009 | Cho et al. |
| 2009/0317540 A1 | 12/2009 | Sandhu et al. |
| 2009/0323385 A1 | 12/2009 | Scheuerlein et al. |
| 2010/0003782 A1 | 1/2010 | Sinha et al. |
| 2010/0008163 A1 | 1/2010 | Liu |
| 2010/0044666 A1 | 2/2010 | Baek et al. |
| 2010/0046273 A1 | 2/2010 | Azuma et al. |
| 2010/0061132 A1 | 3/2010 | Fujisaki et al. |
| 2010/0065836 A1 | 3/2010 | Lee et al. |
| 2010/0072452 A1 | 3/2010 | Kim et al. |
| 2010/0084741 A1 | 4/2010 | Andres et al. |
| 2010/0085798 A1 | 4/2010 | Lu et al. |
| 2010/0090187 A1 | 4/2010 | Ahn et al. |
| 2010/0110759 A1 | 5/2010 | Jin et al. |
| 2010/0123542 A1 | 5/2010 | Vaithyanathan et al. |
| 2010/0135061 A1 | 6/2010 | Li et al. |
| 2010/0140578 A1 | 6/2010 | Tian et al. |
| 2010/0157657 A1 | 6/2010 | Rinerson et al. |
| 2010/0157658 A1 | 6/2010 | Schloss et al. |
| 2010/0163820 A1 | 7/2010 | Son |
| 2010/0163829 A1 | 7/2010 | Wang et al. |
| 2010/0176368 A1 | 7/2010 | Ko et al. |
| 2010/0178729 A1 | 7/2010 | Yoon et al. |
| 2010/0193758 A1 | 8/2010 | Tian et al. |
| 2010/0193761 A1 | 8/2010 | Amin et al. |
| 2010/0193762 A1* | 8/2010 | Hsieh et al. ....................... 257/4 |
| 2010/0195371 A1 | 8/2010 | Ohba et al. |
| 2010/0232200 A1 | 9/2010 | Shepard |
| 2010/0237442 A1 | 9/2010 | Li et al. |
| 2010/0243983 A1 | 9/2010 | Chiang et al. |
| 2010/0258782 A1 | 10/2010 | Kuse et al. |
| 2010/0259960 A1 | 10/2010 | Samachisa |
| 2010/0259961 A1 | 10/2010 | Fasoli et al. |
| 2010/0259962 A1 | 10/2010 | Yan et al. |
| 2011/0059576 A1 | 3/2011 | Cho et al. |
| 2011/0128775 A1 | 6/2011 | Maejima et al. |
| 2011/0171836 A1 | 7/2011 | Xia |
| 2011/0193044 A1 | 8/2011 | Sandhu et al. |
| 2011/0261606 A1 | 10/2011 | Sandhu et al. |
| 2011/0261607 A1 | 10/2011 | Tang et al. |
| 2012/0140542 A1 | 6/2012 | Liu |
| 2012/0147648 A1 | 6/2012 | Scheuerlein |
| 2012/0164798 A1 | 6/2012 | Sills et al. |
| 2012/0187363 A1 | 7/2012 | Liu et al. |
| 2012/0248399 A1 | 10/2012 | Sasago et al. |

FOREIGN PATENT DOCUMENTS

| | | |
|---|---|---|
| CN | 1624803 | 6/2005 |
| CN | 101005113 | 12/2006 |
| CN | 101051670 | 4/2007 |
| CN | 101034732 | 9/2007 |
| CN | 101546602 | 9/2009 |
| CN | 200880124714.6 | 7/2012 |
| CN | 201180027954.6 | 5/2014 |
| EP | 1796103 | 9/2006 |
| EP | 11792836 | 12/2013 |
| EP | 11845727.4 | 11/2014 |
| EP | 11834802 | 3/2015 |
| JP | 2005-0008353 | 1/2005 |
| JP | 2005175457 | 6/2005 |

(56) References Cited

FOREIGN PATENT DOCUMENTS

| JP | 2005-353779 | 12/2005 |
|---|---|---|
| JP | 2006032729 | 2/2006 |
| JP | 2006040981 | 2/2006 |
| JP | 2006074028 | 3/2006 |
| JP | 2006121044 | 5/2006 |
| JP | 10-0751736 | 8/2007 |
| JP | 2008-192995 | 8/2008 |
| JP | 2009-081251 | 4/2009 |
| JP | 2009-163867 | 7/2009 |
| JP | 2009-267411 | 11/2009 |
| JP | 2010-009669 | 1/2010 |
| JP | 2010-010688 | 1/2010 |
| JP | 2010-192569 | 9/2010 |
| JP | 2010-192646 | 9/2010 |
| JP | 2010-232214 | 10/2010 |
| JP | 2010-263211 | 11/2010 |
| KR | 1020060087882 | 8/2006 |
| KR | 20070111840 | 11/2007 |
| KR | 20070118865 | 12/2007 |
| KR | 20090109804 | 10/2009 |
| KR | 20100078808 | 7/2010 |
| KR | 20100083402 | 7/2010 |
| TW | 097147549 | 5/2013 |
| TW | 100119681 | 8/2013 |
| TW | 100142963 | 8/2014 |
| TW | 101102280 | 8/2014 |
| WO | WO 2006/003620 | 1/2006 |
| WO | WO 2008/029446 | 3/2008 |
| WO | PCT/US2008/084422 | 3/2009 |
| WO | WO 2009/127187 | 10/2009 |
| WO | WO 2010/068221 | 6/2010 |
| WO | PCT/US2008/084422 | 7/2010 |
| WO | WO 2010/082922 | 7/2010 |
| WO | WO 2010/082923 | 7/2010 |
| WO | WO 2010/082928 | 7/2010 |
| WO | WO 2010/085241 | 7/2010 |
| WO | WO 2010/087854 | 8/2010 |
| WO | WO 2010/117911 | 10/2010 |
| WO | PCT/US2011/035601 | 11/2011 |
| WO | PCT/US2011/051785 | 4/2012 |
| WO | PCT/US2011/059095 | 5/2012 |
| WO | PCT/US12/021168 | 7/2012 |
| WO | PCT/US2011/066770 | 9/2012 |
| WO | PCT/US2011/035601 | 12/2012 |
| WO | PCT/US2011/051785 | 4/2013 |
| WO | PCT/US2011/059095 | 6/2013 |
| WO | PCT/US2011/066770 | 7/2013 |

OTHER PUBLICATIONS

U.S. Appl. No. 12/099,267, filed Apr. 8, 2008, Smythe et al.
U.S. Appl. No. 12/114,096, filed May 2, 2008, Srinivasan et al.
U.S. Appl. No. 12/141,388, filed Jun. 18, 2008, Liu et al.
U.S. Appl. No. 12/141,559, filed Jun. 18, 2008, Sandhu et al.
U.S. Appl. No. 12/166,604, filed Jul. 2, 2008, Sinha et al.
U.S. Appl. No. 12/701,885, filed Feb. 8, 2010, Sandhu et al.
U.S. Appl. No. 12/765,598, filed Apr. 22, 2010, Sandhu et al.
U.S. Appl. No. 12/765,606, filed Apr. 22, 2010, Tang et al.
U.S. Appl. No. 12,959,015, filed Dec. 2, 2010, Liu.
U.S. Appl. No. 12/979,189, filed Dec. 27, 2010, Sills et al.
U.S. Appl. No. 13/010,048, filed Jan. 20, 2011, Liu et al.
Baek et al., "Multi-Layer cross-point Binary Oxide resistive Memory (OxRRAM) for Post-NAND Storage Application", IEEE, 2005.
Bedeschi et al., "A Bipolar-Selected Phase Change Memory Featuring Multi-Level Cell Storage", IEEE, vol. 44, No. 1, Jan. 2009, pp. 217-227.
Chen et al., "Non-Volatile Resistive Switching for Advanced Memory Applications", IEEE, 2005, 4 pages.
Chen et al., Peroskite RRAM Devices with Metal/Insulator/PCMO/Metal Heterostructures, 2005; pp. 125-128.
Choi et al., "Defect Structure and Electrical Properties of single-Crystal Ba0.03SR0.97TiO3", J. Am Ceram. Soc., 71, [4], pp. 201-205, 1988.
Courtade et al., "Microstructure and resistance switching in NiO binary oxide films obtained from Ni oxidation", IEEE, 2006, pp. 94-99.
Higaki et al., "Effects of Gas Phase Absorption into Si Substrates on Plasma doping Process" A208; Jan. 2004.
Ho et al., "A Highly Reliable Self-=Aligned Graded Oxide WOx Resistance Memory: Conduction Mechanisms and Reliability", 2007 Symposium on VLSI Technology Digest of Technical Papers, pp. 228-229.
Hosoi et al., "High Speed Unipolar Switching Resistance RAM (RRAM) Technology", Advanced Materials Res. Lab, Japan; Correlated Electron Res. Center (CERC), Japan; Nanotechnology Res. Inst. (NRI), Japan, Dec. 2006; 4 pp.
Hudgens et al., "Overview of Phase-Change Chalcogenide Nonvolatile Memory Technology", MRS Bulletin, Nov. 2004, pp. 829-832.
Ignatiev et al., "Resistance Non-volatile Memory-RRAM", Mater. Res. Soc. Symp. Proc., vol. 997, 2007, Materials Research Society, 9 pages.
Karg et al., "Nanoscale REsistive Memory Device using SrRiO3 Films", IEEE, 2007, pp. 68-70.
Kau et al., "A Stakable cross point phase change memory", IEEE, 2009, pp. 27.1.1-27.1.4.
Komori et al., Disturbless flash memory due to high boost efficiency on BiCS structure and optimal memory film stack for ultra high density storage device; Dec. 2008; pp. 851-854.
Kooij et al., "Photoselective Metal Deposition on Amorphous Silicon p-i-n Solar Cells", Electrochemical Society Letters, Journal of Electrochemical Society vol. 44, No. 10, Oct. 1997, pp. L271-L272.
Kozicki et al., "Non-Volatile Memory Based on Solid Electrolytes", Center for Solid State Electronics Research, Arizona State University, Nov. 2004; 8 pp.
Kozicki, "Memory Devices Based on Solid Electrolytes", Mater. Res. Soc. Symp. Proc., vol. 997, 2007, Materials Research Society, 10 pages.
Lee et al., "2-stack 1D-1R Cross-Point Structure with Oxide Diodes as Switch Elements for High Density Resistance RAM Applications", IEEE, 2007, pp. 771-774.
Lee et al., "Resistance Switching of Al doped ZnO for Non-Volatile Memory Applications", Dept. of Materials Science and Engineering, Gwangju Institute of Science and Technology, May 2006, 2 pp.
Lin et al., "Effect of Top Electrode Material on REsistive Switching Properties of ZrO2 Film Memory Devices", IEEE, May 2007, vol. 28, No. 5, pp. 366-368.
Meyer et al., "Oxide Dual-Layer Memory Element for Scalable Non-Volatile Cross-Point Memory Technology", IEEE, 2008, 5 pages.
Miyashita et al., "A Novel Bit-Line Process using Poly-Si Masked Dual Damascene (PMDD) for 0.13 um DRAMs and Beyond", IEEE, 2000, pp. 15.4.1-15.4.4.
Muller et al., "Emerging Non-Volatile Memory Technologies", IEEE, 2003, pp. 37-44.
Oh, "Full Integration of Highly Manufacturable 512Mb PRAM based on 90nm Technology" 2006, IEEE, 4 pages.
Pein et al., "Performance of the 3-D Pencil Flash EPROM Cell Memory Array", IEEE, 1995, pp. 1982-1991.
Pellizzer et al., "A 90nm Phase Change Memory Technology for Stand-Alone Non-Volatile Memory Applications", IEEE, 2006, Symposium on VLSI Technology Digest of Technical Papers, 2 pages.
Pirovano et al., "Self-Aligned u Trench Phase-Change Memory Cell Architecture for 90nm Technology and Beyond", IEEE, 2007, pp. 222-225.
Programmable metallization cell, Dec. 11, 2007; http://en.wikipedia.org/wiki/Programmable_metallization_cell on Dec. 13, 2011.
Scheck et al., "Selective Metal Electrodeposition Through Doping Modulation of Semiconductor Surfaces". Applied Physics Letters 86, 2005, 3 pgs.
Website, http://en.wikipedia.org/wiki/Programmable_metallization_cell; Dec. 11, 2007; Place of Publication is the Internet; 4 pp.
Wuttig, "Towards a Universal Memory?", Nature Materials, vol. 4, Apr. 2005, pp. 265-266.
Xing et al., "Characterization of AlGaN/GaN p-n Diodes with Selectively Regrown n-AlGaN by Metal-organic Chemical-Vapor Depo-

(56) References Cited

OTHER PUBLICATIONS sition and its Application to GaN-Based Bipolar Transistors", Journal of Applied Physics 97, 2005, 4 pgs.

Yih et al., "SiC/Si Heterojunction Diodes Fabricated by Self-Selective and by Blanket Rapid Thermal Chemical Vapor Deposition", IEEE vol. 41 No. 3, Mar. 1994, pp. 281-287.

Yoon et al., "Vertical Cross-Point Resistance Change Memory for Ultra-High Density Non-volatile Memory Applications", 2009 Symposium on VLSI Technology Digest of Technical Papers, pp. 26-27.

Yu et al., "Structure Effects on Resistive Switching of Al/TiOx/Al Devices for RRAM Applications", IEEE, 2008, pp. 331-333.

* cited by examiner

NONVOLATILE MEMORY CELLS AND METHODS OF FORMING NONVOLATILE MEMORY CELLS

RELATED PATENT DATA

This patent resulted from a continuation application of U.S. patent application Ser. No. 12/917,348, filed Nov. 1, 2010, entitled "Nonvolatile Memory Cells And Methods Of Forming Nonvolatile Memory Cells" naming Nirmal Ramaswamy and Gurtej S. Sandhu as inventors, the disclosure of which is incorporated by reference.

TECHNICAL FIELD

Embodiments disclosed herein pertain to nonvolatile memory cells, and to methods of forming memory cells.

BACKGROUND

Memory is one type of integrated circuitry, and is used in computer systems for storing data. Such is usually fabricated in one or more arrays of individual memory cells. The memory cells might be volatile, semivolatile, or nonvolatile. Nonvolatile memory cells can store data for extended periods of time, in many instances including when the computer is turned off. Volatile memory dissipates and therefore requires being refreshed/rewritten, in many instances multiple times per second. Regardless, the smallest unit in each array is termed as a memory cell and is configured to retain or store memory in at least two different selectable states. In a binary system, the states are considered as either a "0" or a "1". In other systems, at least some individual memory cells may be configured to store more than two levels or states of information.

Integrated circuitry fabrication continues to strive to produce smaller and denser integrated circuits. Accordingly, the fewer components an individual circuit device has, the smaller the construction of the finished device can be. Likely the smallest and simplest memory cell will be comprised of two current conductive electrodes having a programmable material received there-between. The programmable material is selected or designed to be configured in a selected one of at least two different resistive states to enable storing of information by an individual memory cell. The reading of the cell comprises determination of which of the states the programmable material is in, and the writing of information to the cell comprises placing the programmable material in a predetermined resistive state. Some programmable materials retain a resistive state in the absence of refresh, and thus may be incorporated into nonvolatile memory cells.

Some programmable materials may contain mobile charge carriers larger than electrons and holes, for example ions in some example applications. Regardless, the programmable materials may be converted from one memory state to another by moving the mobile charge carriers therein to alter a distribution of charge density within the programmable materials. Some example memory devices that utilize ions as mobile charge carriers are resistive RAM (RRAM) cells; which can include classes of memory cells containing multivalent oxides, and which can include memristors in some specific applications. Other example memory devices that utilize ions as charge carriers are programmable metallization cells (PMCs); which may be alternatively referred to as a conductive bridging RAM (CBRAM), nanobridge memory, or electrolyte memory.

The RRAM cells may contain programmable material sandwiched between a pair of electrodes. The programming of the RRAM cells may comprise transitioning the programmable material between first a memory state in which charge density is relatively uniformly dispersed throughout the material and a second memory state in which the charge density is concentrated in a specific region of the material (for instance, a region closer to one electrode than the other).

A PMC cell may similarly have programmable material sandwiched between a pair of current conductive electrodes. The PMC programmable material comprises ion conductive material, for example a suitable chalcogenide or any of various suitable oxides. A suitable voltage applied across the electrodes generates current conductive super-ionic clusters or filaments. Such result from ion transport through the ion conductive material which grows the clusters/filaments from one of the electrodes (the cathode), through the ion conductive material, and toward the other electrode (the anode). The clusters or filaments create current conductive paths between the electrodes. An opposite voltage applied across the electrodes essentially reverses the process and thus removes the current conductive paths. A PMC thus comprises a high resistance state (corresponding to the state lacking a current conductive filament or clusters between the electrodes) and a low resistance state (corresponding to the state having a current conductive filament or clusters between the electrodes), with such states being reversibly interchangeable with one another.

DETAILED DESCRIPTION OF EXAMPLE EMBODIMENTS

Figure 1:
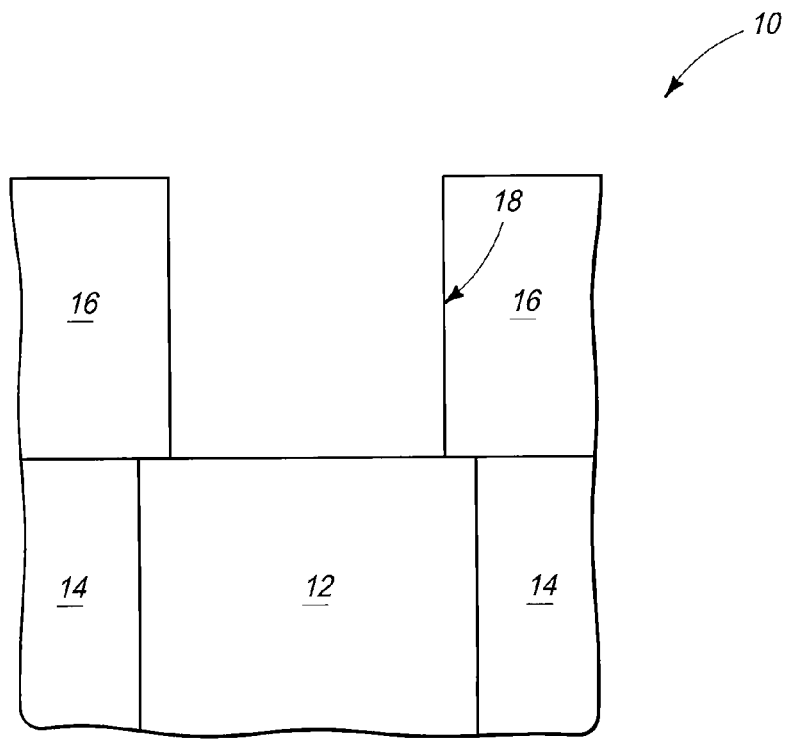
FIG. 1 is a diagrammatic sectional view of a substrate in process in accordance with an embodiment of the invention.

Embodiments of the invention encompass methods of forming a non-volatile memory cell, and non-volatile memory cells independent of method of manufacture. Example method embodiments are initially described with reference to FIGS. 1-9 and 9A. Referring to FIG. 1, a substrate fragment 10 comprises current conductive material 12 received within dielectric material 14. Either may be homogenous or non-homogenous. In the context of this document, "current conductive material" is a composition where electric current flow would inherently occur therein predominantly by movement of subatomic positive and/or negative charges when such are generated as opposed to predominantly by movement of ions. Current conductive material 12 may be considered as a current conductor which, by way of example, may be in the form of a longitudinally elongated conductive line such as a data/sense line (i.e., a bit line), an access line (i.e., a word line), or any other existing or yet-to-be-developed current conductive line. Example current conductive materials are elemental metals, alloys of elemental metals, current conductive metal compounds, and conductively doped semiconductive material, including any combinations thereof. Example suitable dielectrics include silicon nitride and doped or undoped silicon dioxide, such as boron and/or phosphorous doped silicate glasses.

Materials 12 and 14 may be fabricated relative to or supported by a suitable base substrate (not shown), for example a semiconductor substrate which may comprise monocrystalline silicon and/or other semiconductive material. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above.

Substrate 10 includes dielectric material 16 through which an opening 18 has been formed to current conductor 12. Dielectric material 16 may be homogenous or non-homogenous, and may be the same composition as dielectric material 14. An example thickness range for material 16 is from about 10 nanometers to 100 nanometers. Opening 18 may be of any suitable horizontal cross sectional shape (not shown in FIG. 1), with circular, square, rectangular, elliptical, oval, longitudinally elongated, trench-like, etc. being examples. Such may be formed by any suitable existing or yet-to-be-developed technique, with photolithographic patterning and subsequent subtractive etching of material 16 being but one example. In one embodiment, opening 18 has a maximum lateral open dimension of no greater than about 20 nanometers.

In this document, vertical is a direction generally orthogonal to a primary surface relative to which the substrate is processed during fabrication and which may be considered to define a generally horizontal direction. Further, "vertical" and "horizontal" as used herein are generally perpendicular directions relative one another independent of orientation of the substrate in three dimensional space. Further in this document, "elevational" and "elevationally" are with reference to the vertical direction from a base substrate upon which the circuitry is fabricated.

Figure 2:
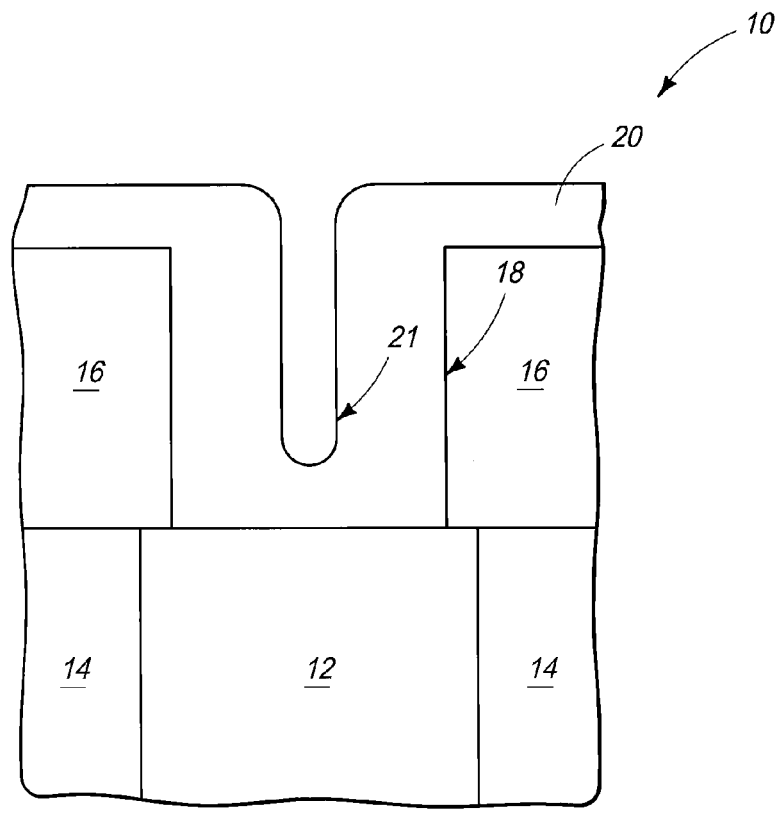
FIG. 2 is a view of the FIG. 1 substrate at a processing step subsequent to that shown by FIG. 1.
Figure 3:
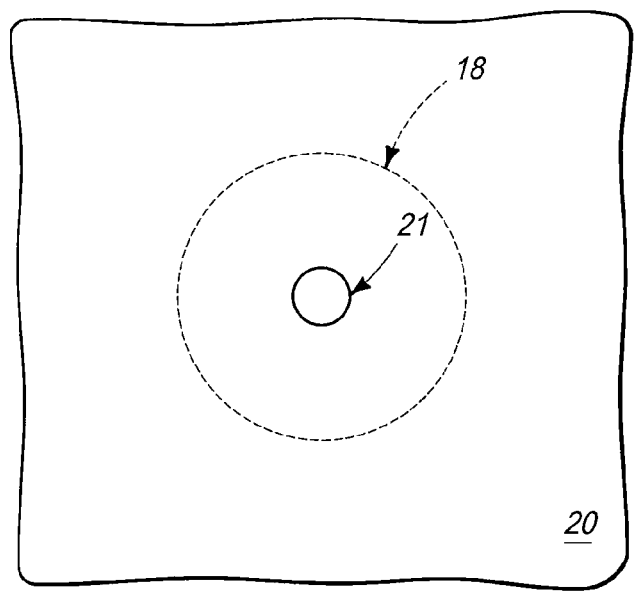
FIG. 3 is top view of FIG. 2.

Referring to FIGS. 2 and 3, a first current conductive material 20 has been formed as a lining elevationally over dielectric material 16 and laterally against sidewalls of opening 18 to less than fill such opening, thereby leaving a remaining opening 21 within opening 18. First conductive lining 20 has been formed in current conductive connection with current conductor 12, may be homogenous or non-homogenous, and may be partially or wholly electrochemically active or inactive. By way of examples only, suitable current conductive and electrochemically inactive materials include titanium nitride, tantalum nitride, rhodium, ruthenium, ruthenium oxide, nickel, cobalt, aluminum, tungsten, platinum, and alloys including at least one of gold, tungsten, platinum, or gold. Example suitable current conductive and electrochemically active materials include copper, silver, and alloys including at least one of copper and silver.

Figure 4:
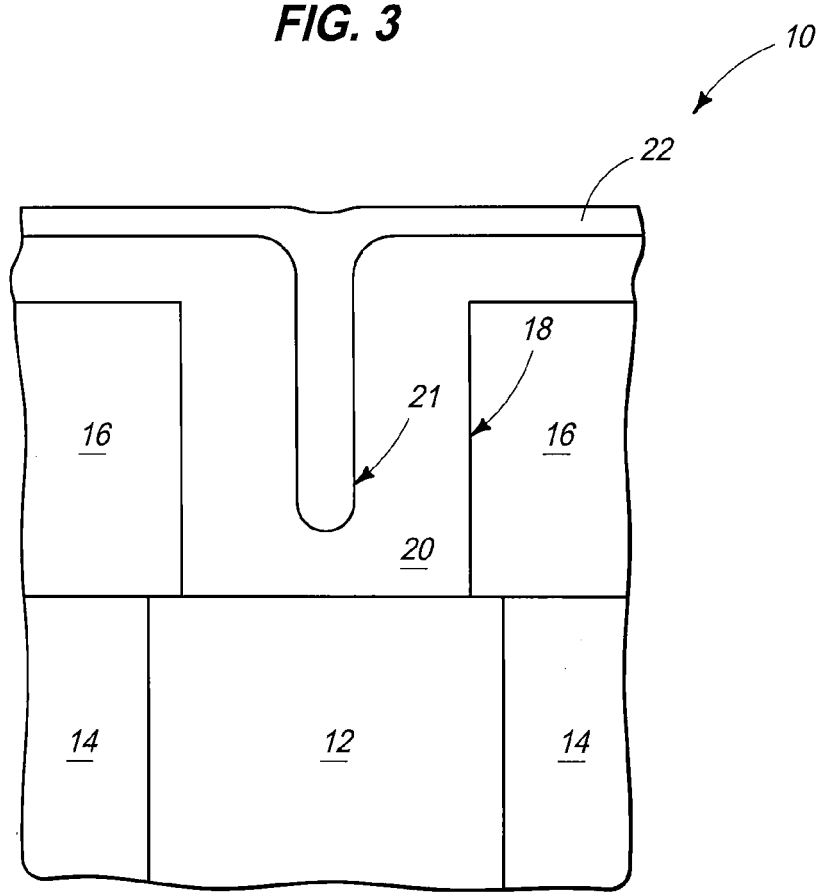
FIG. 4 is a view of the FIG. 2 substrate at a processing step subsequent to that shown by FIG. 2.

Referring to FIG. 4, a second current conductive material 22 has been formed over first conductive lining 20 and within openings 18 and 21 laterally over inwardly facing sidewalls of first conductive lining 20. In one embodiment, second conductive material 22 fills the volume of opening 21 formed or left by formation of first conductive material lining 20. Regardless, second conductive material 22 has been formed in current conductive connection with first conductive lining 20, may be homogenous or non-homogenous, and may be partially or wholly electrochemically active or inactive. Second conductive material 22 may be of different composition from that of first conductive material 20, with the above example compositions for first conductive material 20 also being usable for second conductive material 22.

Figure 5:
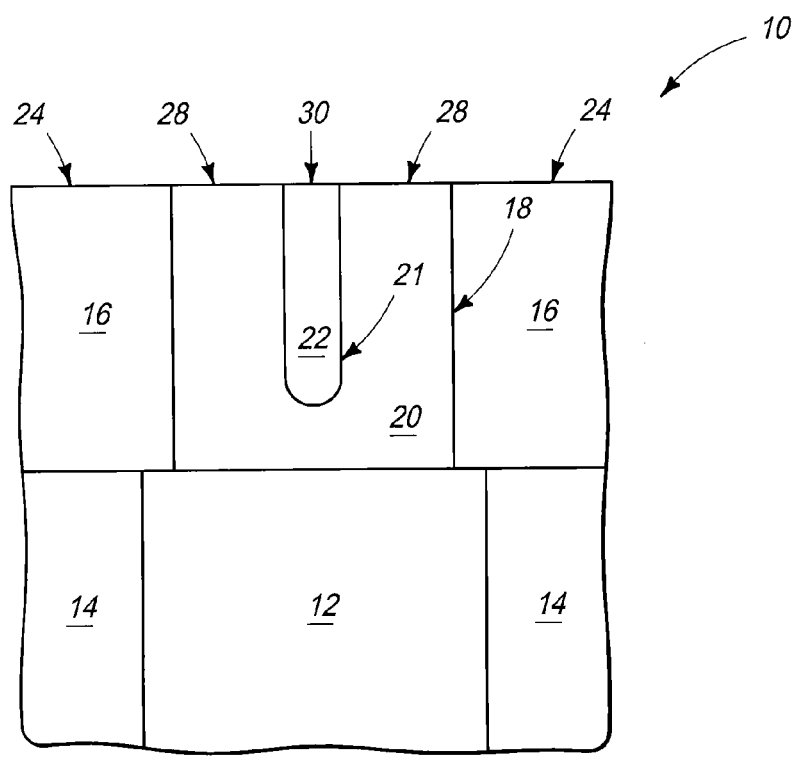
FIG. 5 is a view of the FIG. 4 substrate at a processing step subsequent to that shown by FIG. 4.

Referring to FIG. 5, first conductive material 20 and second conductive material 22 have been removed from being received elevationally over dielectric material 16 through which opening 18 was formed. Any suitable technique may be used, with chemical-mechanical polishing being an example. Some of dielectric material 16 may also be removed in the process. Dielectric material 16, first conductive material 20, and second conductive material 22 may be considered as having elevationally outermost surfaces or tops 24, 28 and 30, respectively. One, two, and/or three of such may be planar, and in one embodiment may be horizontally planar. In one embodiment, portions of any two or three of surfaces 24, 28 and 30 are elevationally coincident, with all three being shown as being planar and elevationally coincident proximate opening 18 in FIG. 5. Regardless, FIG. 5 also depicts an example wherein all of the second conductive material 22 is laterally surrounded by the first conductive material immediately prior to an example act of recessing described immediately below.

Figure 6:
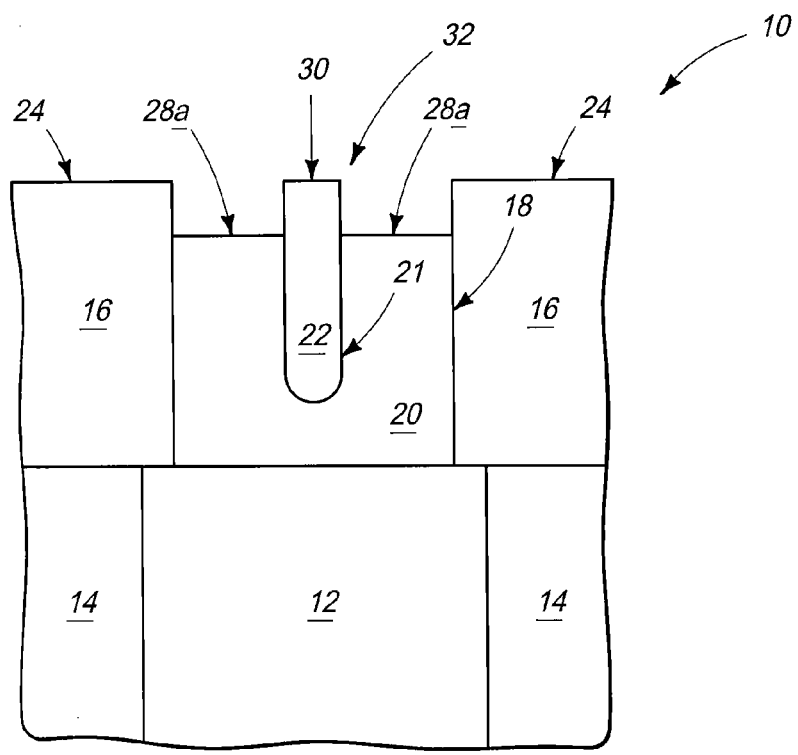
FIG. 6 is a view of the FIG. 5 substrate at a processing step subsequent to that shown by FIG. 5.
Figure 7:
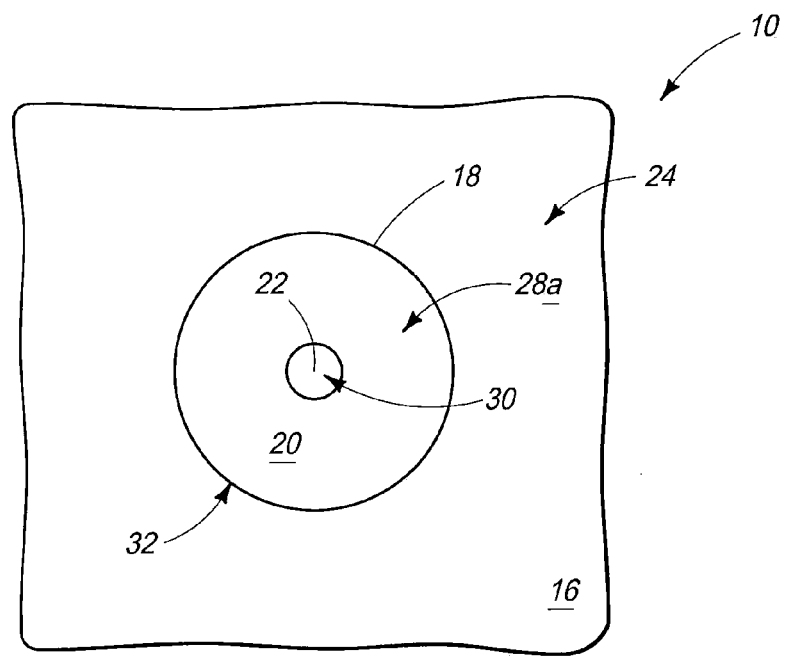
FIG. 7 is top view of FIG. 6.

Referring to FIGS. 6 and 7, first conductive material 20 has been elevationally recessed within opening 18 to leave second conductive material 22 projecting elevationally outward relative to material 20. An example depth of recess from the outmost surface of material 16 proximate opening 18 at the conclusion of such recessing is from about 1 nanometer to about 50 nanometers. In combination, first conductive material 20 and projecting second conductive material 22 comprise a first electrode 32 of the non-volatile memory cell which is being formed. Any suitable existing or yet-to-be-developed technique may be used to recess first conductive material 20, with a timed isotropic or anisotropic etch of material 20 selectively relative to material 22 being an example. In the context of this document, a selective etch requires removal of one material relative to a stated other material at a ratio of at least 1.5:1. In one embodiment, such etching may also comprise etching first conductive material 20 selectively relative to dielectric material 16 which is exposed at least some time during such etching. Even if selective, such etching or other removal technique may remove some of dielectric material 16 and/or second conductive material 22 whereby their respective elevationally outermost surfaces may move elevationally inward. FIGS. 6 and 7 depict an example embodiment wherein essentially no removal has occurred of dielectric material 16 and second conductive material 22, and whereby outermost surface 28 of FIG. 5 has been recessed inwardly and designated as 28a.

Figure 8:
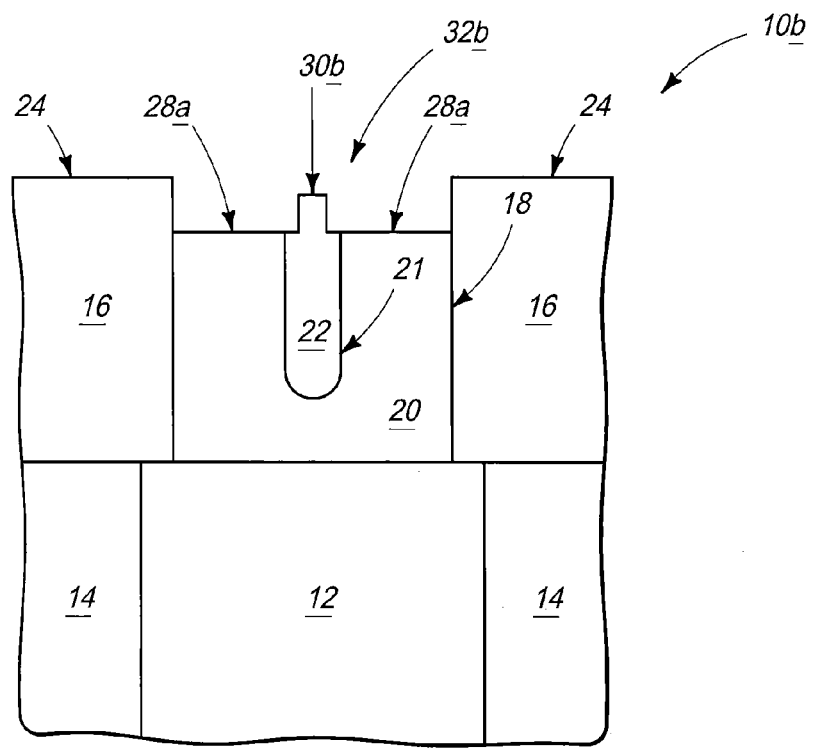
FIG. 8 is a view of an alternate embodiment substrate to that shown by FIG. 6.

Alternately, where some of second conductive material 22 is also etched, it may reduce in lateral dimension and/or projecting height above first conductive material 20. Such is shown by way of example only in FIG. 8 with respect to a substrate fragment 10b. Like numerals from the FIG. 6 embodiment have been used where appropriate, with some construction differences being indicated by the suffix "b". In FIG. 8, second conductive material 22 has been etched both laterally and elevationally. Thereby, second conductive material 22 of first electrode 32b has an elevationally outermost surface 30b which is inward of surface 30 of FIG. 5.

Regardless, in one embodiment and as shown, second conductive material 22 orthogonally projects elevationally outward from first current conductive material 20. Other projection angles are contemplated. Further and regardless, the act of recessing may form first conductive material 20 to have a planar or non-planar elevationally outermost surface, with a planar elevationally outermost surface 28a being shown. In one embodiment, the second current conductive material projecting from the first current conductive material is formed to have a maximum lateral dimension which is less than F, where F is a minimum feature dimension of lithographically-defined features of the substrate.

Figure 9:
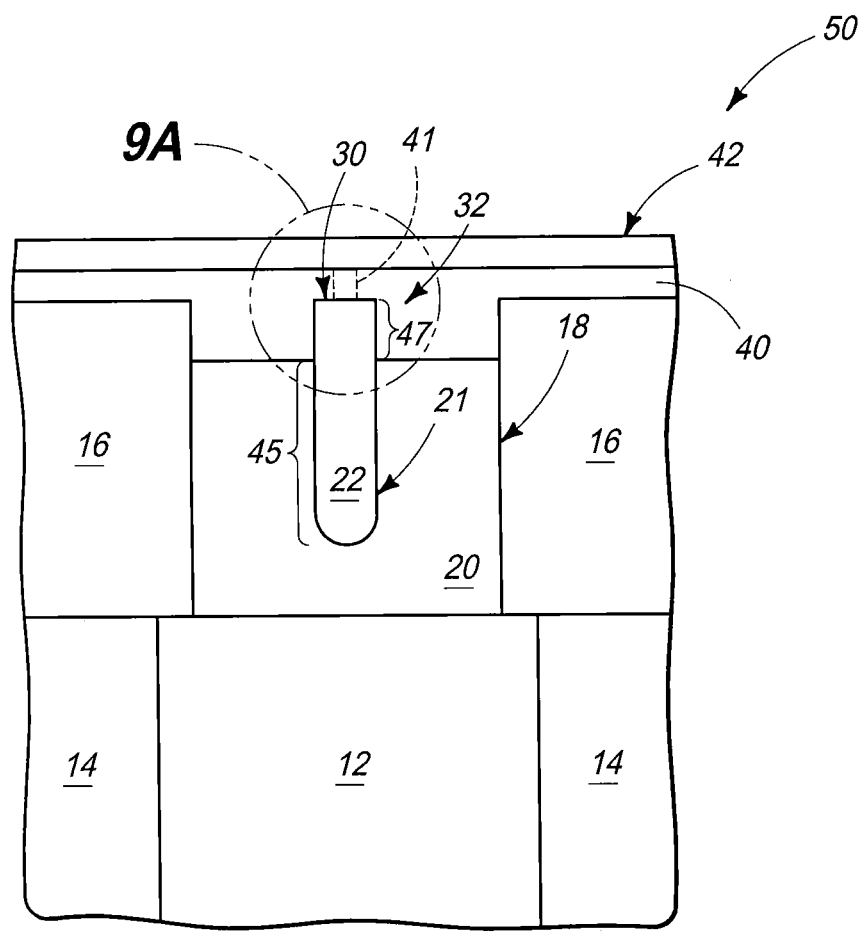
FIG. 9 is a view of the FIG. 6 substrate at a processing step subsequent to that shown by FIG. 6.

Referring to FIG. 9, programmable material 40 (which will comprise a programmable region of the memory cell) has been formed elevationally over dielectric material 16 through which opening 18 was formed, to within such opening elevationally and laterally over second current conductive material 22 projecting from first current conductive material 20, and within such opening elevationally over recessed first current conductive material 20. An example thickness range for programmable material 40 is from about 1 nanometer to about 20 nanometers. Such may be solid, gel, amorphous, crystalline, or any other suitable phase, and may be homogenous or non-homogenous. Any existing or yet-to-be developed programmable material 40 may be used, with only some examples being provided below.

Programmable material 40 may comprise ion conductive material. Example suitable such materials comprise chalcogenide-type (for instance, materials comprising one or more of germanium, selenium, antimony, tellurium, sulfur, copper, etc.; with example chalcogenide-type materials being $Ge_2Sb_2Te_5$, $GeS_2$, $GeSe_2$, $CuS_2$, and CuTe) and/or oxides such as zirconium oxide, hafnium oxide, tungsten oxide, copper oxide, niobium oxide, iron oxide, silicon oxide (specifically, silicon dioxide), gadolinium oxide, etc. capable of inherently (or with additive) supporting electrolyte behavior. Such may have silver, copper, cobalt, and/or nickel ions, and/or other suitable ions, diffused therein for ionic conduction, analogously to structures disclosed in U.S. Pat. No. 7,405,967 and U.S. Patent Publication Number 2010/0193758.

Additional example programmable materials include multi-resistive state metal oxide-comprising material. Such may comprise, for example, at least two different layers or regions generally regarded as or understood to be active or passive regions, although not necessarily. Alternately, such may only comprise active material. Example active cell region compositions which comprise metal oxide and can be configured in multi-resistive states include one or a combination of $Sr_xRu_yO_z$, $Ru_xO_y$, and $In_xSn_yO_z$. Other examples include MgO, $Ta_2O_5$, $SrTiO_3$, $SrZrO_3$, $BaTiO_3$, $Ba_{(1-x)}Sr_x$-$TiO_3$, $ZrO_x$ (perhaps doped with La), and $CaMnO_3$ (doped with one or more of Pr, La, Sr, or Sm). Example passive cell region compositions include one or a combination of $Al_2O_3$, $TiO_2$, and $HfO_2$. Regardless, a programmable material composite might comprise additional metal oxide or other materials not comprising metal oxide. Example materials and constructions for a multi-resistive state region comprising one or more layers including a programmable metal oxide-comprising material are described and disclosed in U.S. Pat. Nos. 6,753,561; 7,149,108; 7,067,862; and 7,187,201, as well as in U.S. Patent Application Publication Nos. 2006/0171200 and 2007/0173019. Further as is conventional, multi-resistive state metal oxide-comprising materials encompass filament-type metal oxides, ferroelectric metal oxides and others, and whether existing or yet-to-be developed, as long as resistance of the metal oxide-comprising material can be selectively changed.

The programmable material may comprise memristive material. As an example, programmable material 40 may be statically programmable semiconductive material which comprises mobile dopants that are received within a dielectric such that the material is statically programmable between at least two different resistance states. At least one of the states includes localization or gathering of the mobile dopants such that a dielectric region is formed within material 40, and thereby provides a higher resistance state. Further, more than two programmable resistance states may be used. In the context of this document, a "mobile dopant" is a component (other than a free electron) of the semiconductive material that is movable to different locations within said dielectric during normal device operation of repeatedly programming the device between at least two different static states by application of voltage differential to the pair of electrodes. Examples include atom vacancies in an otherwise stoichiometric material, and atom interstitials. Specific example mobile dopants include oxygen atom vacancies in amorphous or crystalline oxides or other oxygen-containing material, nitrogen atom vacancies in amorphous or crystalline nitrides or other nitrogen-containing material, fluorine atom vacancies in amorphous or crystalline fluorides or other fluorine-containing material, and interstitial metal atoms in amorphous or crystalline oxides. More than one type of mobile dopant may be used. Example dielectrics in which the mobile dopants are received include suitable oxides, nitrides, and/or fluorides that are capable of localized electrical conductivity based upon sufficiently high quantity and concentration of the mobile dopants. The dielectric within which the mobile dopants are received may or may not be homogenous independent of consideration of the mobile dopants. Specific example dielectrics include $TiO_2$, AlN, and/or $MgF_2$. Example programmable materials that comprise oxygen vacancies as mobile dopants may comprise a combination of $TiO_2$ and $TiO_{2-x}$ in at least one programmed resistance state depending on location of the oxygen vacancies and the quantity of the oxygen vacancies in the locations where such are received. An example programmable material that comprises nitrogen vacancies as mobile dopants is a combination of AlN and $AlN_{1-x}$ in at least one programmed state depending on location of the nitrogen vacancies and the quantity of the nitrogen vacancies in the locations where such are received. An example programmable material that comprises fluorine vacancies as mobile dopants may is a combination of $MgF_2$ and $MgF_{2-x}$ in at least one programmed resistance state depending on location of the fluorine vacancies and the quantity of the fluorine vacancies in the locations where such are received. As another example, the mobile dopants may comprise aluminum atom interstitials in a nitrogen-containing material.

Still other example programmable materials include polymer materials such as Bengala Rose, $AlQ_3Ag$, Cu-TCNQ, DDQ, TAPA, and fluorescine-based polymers.

A second electrode 42 has been formed over programmable material 40. Such may be homogenous or non-homogenous. In an embodiment where material 40 comprises ion conductive material, at least one of first electrode 32 and second electrode 42 has an electrochemically active surface directly against ion conductive material 40. In this document, a material or structure is "directly against" another when there is at least some physically touching contact of the stated materials or structures relative one another. In contrast, "over" encompasses "directly against" as well as constructions where intervening material(s) or structure(s) result(s) in no physical touching contact of the stated material(s) or structure(s) relative one another. Example suitable current conductive and electrochemically active or inactive materials for second electrode 42 include those described above for first current conductive material 20. In one embodiment, only one of the first and second electrodes has an electrochemically active surface directly against ion conductive material whereby the other is void of such a surface directly against ion conductive material. In one embodiment, the second electrode has an electrochemically active surface received directly against ion conductive material and the first and second conductive materials of the first electrode are void of any electrochemically active surface received directly against ion conductive material. In one embodiment, the second current conductive material is electrochemically active and the first current conductive material is void of any electrochemically active surface received against ion conductive material. In one embodiment, neither the first nor second current conductive electrodes has an electrochemically active surface against the programmable material.

One, both, or neither of programmable material 40 and second electrode 42 might be patterned to form an isolated outline of a single non-volatile memory cell. Regardless, FIG. 9 depicts an example resultant non-volatile memory cell 50 which includes electrodes 32 and 42 having programmable material 40 received there-between.

An embodiment of the invention encompasses a method of forming a non-volatile memory cell including forming a first electrode comprising a first current conductive material and a second current conductive material which is different in composition from the first. By way of example only, the processing depicted by FIGS. 1-5 discloses but one such example, and yet which is independent of presence of materials 12, 14 and 16. Regardless, the first conductive material is elevationally recessed to leave second conductive material projecting elevationally outward from the first conductive material. A programmable region is formed over the first current conductive material and over the projecting second conductive material of the first electrode. A second electrode is formed over the programmable region. In one embodiment, the programmable region comprises ion conductive material and at least one of the first and second electrodes has an electrochemically active surface directly against the ion conductive material.

An embodiment of the invention encompasses a method of forming a non-volatile memory cell including forming a first opening within dielectric material and circumferentially lining it with a first current conductive material to leave a second circumferentially self-aligned opening within the first current conductive material. The processing of FIG. 2 depicts such an example relative to dielectric material 16, yet independent of presence of materials 12 and 14, and with an opening 21 comprising such a second circumferentially self-aligned opening. In the context of this document, "self-aligned" means a technique whereby at least a lateral surface of a structure is defined by deposition of material against a sidewall of a previously patterned structure. In the context of this document, "circumferentially self-aligned" is a self-aligned technique whereby all lateral surfaces of a structure are defined by deposition of material against an encircling sidewall of a previously patterned structure.

A second current conductive material is formed within the second circumferentially self-aligned opening, with the processing of FIG. 4 showing but one example. The first and second current conductive materials may be of different compositions. Regardless, elevational recessing and subsequent formation of ion conductive material and a second electrode may occur as described above.

An embodiment of the invention encompasses a method of forming a non-volatile memory cell including forming a first electrode comprising a first current conductive material and a circumferentially self-aligned second current conductive material projecting elevationally outward therefrom. The first and second current conductive materials are of different composition relative one another. The second current conductive material may be received elevationally inward and elevationally outward of an elevationally outermost surface of the first current conductive material. In other words, such embodiment contemplates a second current conductive material in current conductive connection atop (not necessarily within) a first current conductive material as long as the second current conductive material is formed by a circumferentially self-aligning technique. In one embodiment, the first current conductive material comprises an annular portion received circumferentially about and elevationally coincident with a portion of the second current conductive material. In one embodiment, that portion of the second current conductive material is radially centered relative to the annular portion of the first current conductive material. FIGS. 4-6 and FIG. 8 depict example such embodiments.

A programmable region is ultimately formed over the first current conductive material and over the projecting second current conductive material of the first electrode. A second electrode is formed over the programmable region. In one embodiment, the programmable region comprises ion conductive material and at least one of the first and second electrodes has an electrochemically active surface directly against the ion conductive material.

Figure 9A:
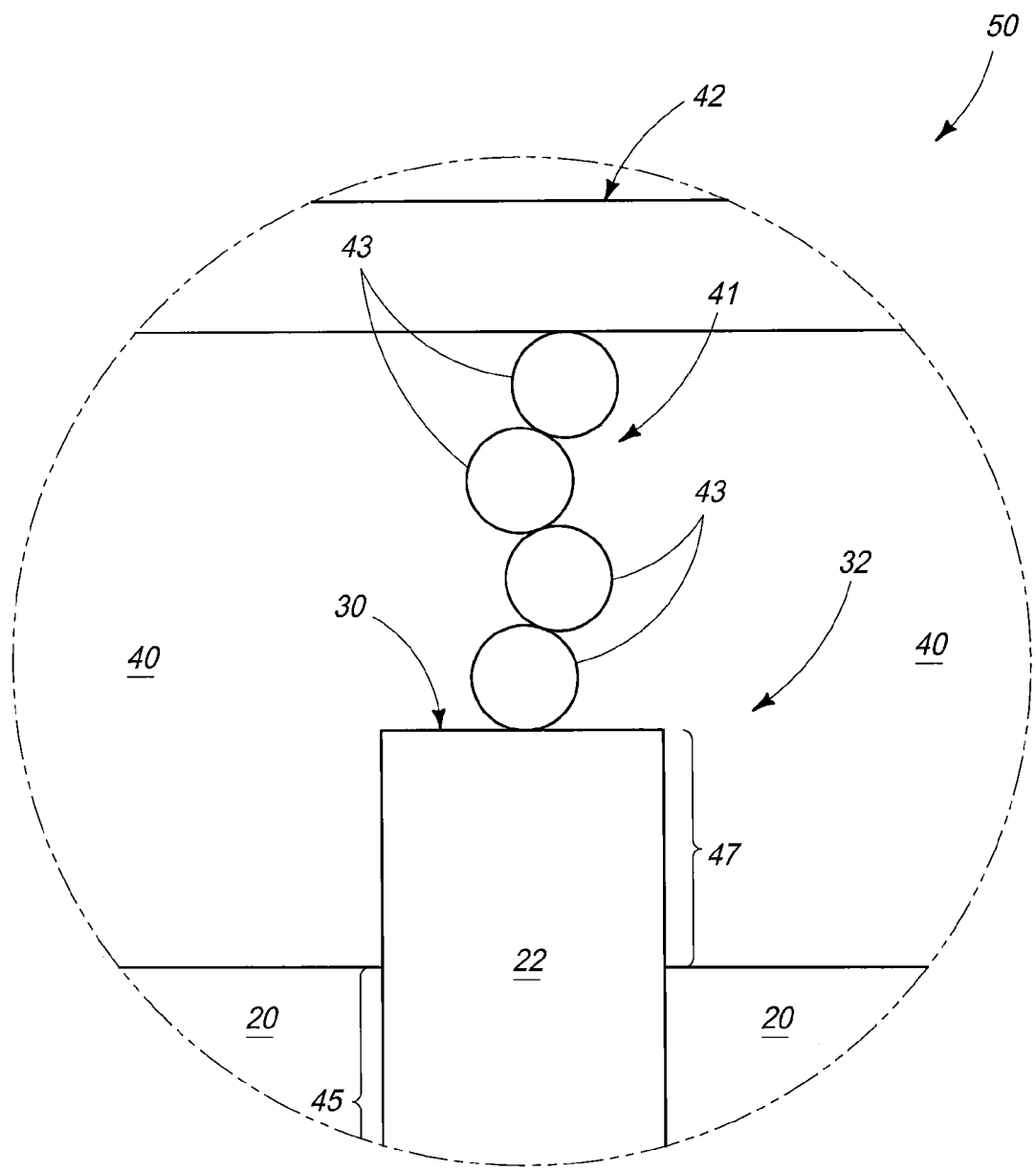
FIG. 9A is an enlargement of a portion of FIG. 9.

FIGS. 9 and 9A diagrammatically depict memory cell 50 as being programmed in an example low resistance "1" state, wherein a low electrical resistance (current conductive) conduction path 41 has been formed through programmable region 40. Conduction path 41 extends from and between a surface of first electrode 32 (i.e., from elevationally outermost surface 30 of second conductive material 22) and a surface of second electrode 42. Where for example the programmable region comprises ion conductive material, conduction path 41 may be in the form of a path of current conductive particles 43 which may or may not be directly against one another, with single ions and super-ionic clusters being examples. In some embodiments, the conduction path may be a filament, for example as described in U.S. Patent Publication No. 2010/01100759. Conduction path 41 may be formed by application of a suitable electric field through an ion conductive material 40 to cause ions from the electrochemically active surface of one electrode to pass towards the opposing electrode and grow conduction path 41 through ion conductive material 40 from such opposing electrode. Such may be achieved by providing a suitable voltage differential to electrodes 32 and 42. Memory cell 50 may be programmed to an example high resistance "0" state (not shown) by at least reversing polarity of the voltage differential to reverse the process, thereby removing conduction path 41. Memory cell 50 may thereby be repeatedly programmable between at least two programmed states by application of suitable voltage differentials to move between programmed states. Alternately by way of example, oxide or other based memory may form a local conduction path or bridge 41 through oxidation/reduction reaction.

Alternately or additionally considered, in a lower resistance state, a programmable region may have mobile charge carriers relatively uniformly dispersed throughout. In a higher resistance state, mobile charge carriers may be concentrated near one of the electrodes to form a more positively charged region adjacent the one electrode. The concentration of charge within the programmable region may be considered as a charge gradient going from $\delta^-$ to $\delta^+$ along a direction from the other electrode toward the one electrode.

Embodiments of the invention encompass non-volatile memory cells independent of method of manufacture. In one embodiment, such a memory cell comprises a first electrode, a second electrode, and a programmable region received between the first and second electrodes. In one embodiment where the programmable region comprises ion conductive material, at least one of the first and second electrodes has an electrochemically active surface directly against the ion conductive material. The first electrode comprises a first current conductive material and a second current conductive material different in composition from the first current conductive material. The second current conductive material has a first portion laterally surrounded by the first current conductive material and a second portion projecting elevationally outward from the first current conductive material and from the first portion. The programmable region is received over the projecting second current conductive material. FIGS. 9 and 9A in conjunction with FIG. 7 depicts such an example non-volatile memory cell 50, with an example such first portion 45 and an example such second portion 47 being designated in FIGS. 9 and 9A. Other attributes as described above may apply. As examples thereof, one or both of the first and second current conductive materials may comprise a planar elevationally outermost surface, and/or the second current conductive material may project orthogonally or otherwise relative to a planar elevationally outermost surface of the first current conductive material. Further, where the programmable material comprises ion conductive material, the first and/or second electrode may have an electrochemically active surface directly against the ion conductive material.

Figure 10:
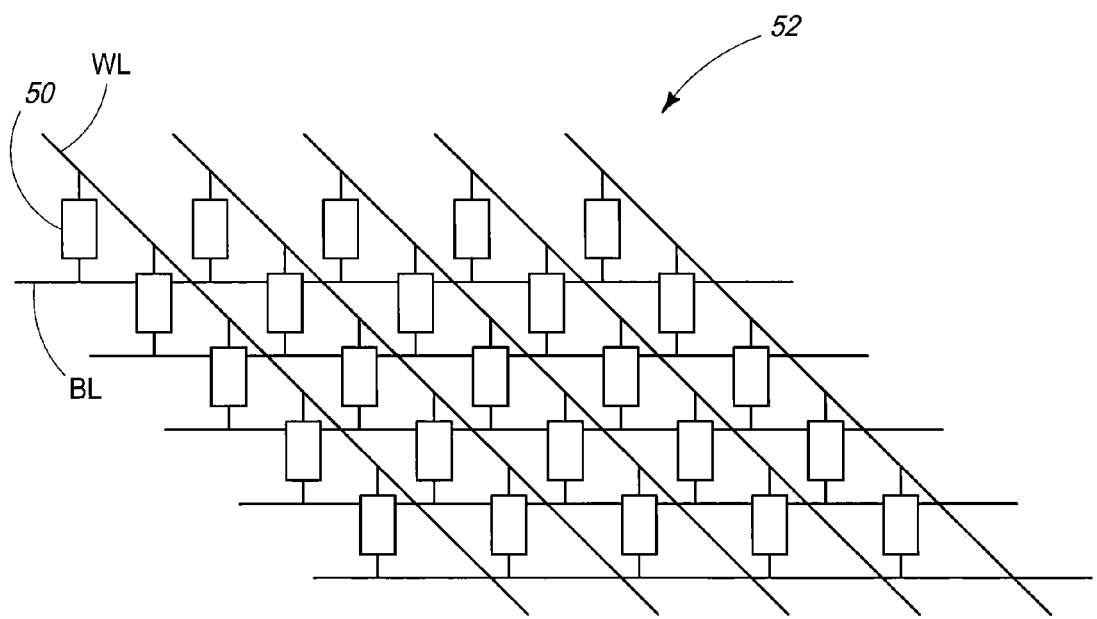
FIG. 10 is a diagrammatic and perspective schematic view of a memory array incorporating nonvolatile memory cells in accordance with an embodiment of the invention.

FIG. 10 is a schematic diagram of incorporation of a plurality of non-volatile memory cells 50 within a memory array 52. Such includes a plurality of access lines (i.e., word lines WL) and a plurality of data/sense lines (i.e., bit lines BL) forming a cross point-like array. A non-volatile memory cell 50, for example as described above, is received at each cross point of an access line WL and a data/sense line BL. Select devices may be at each intersection of an access line WL and a data/sense line BL.

Figure 11:
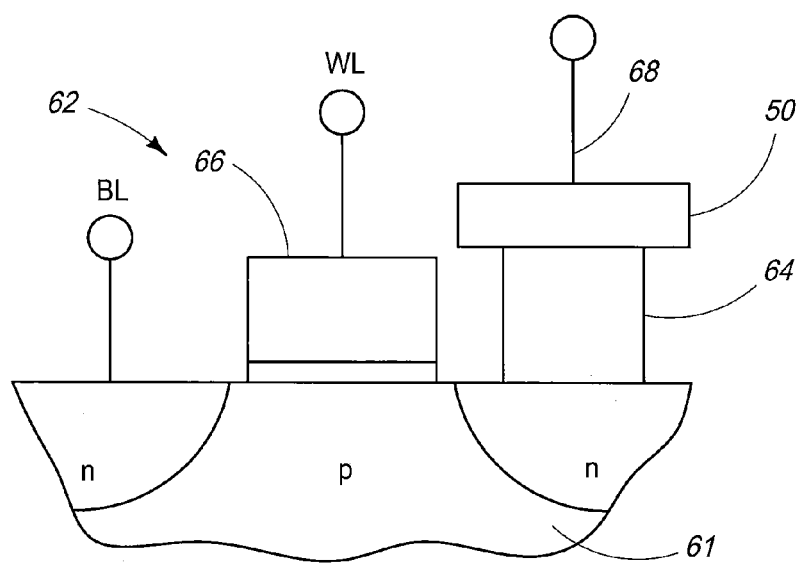
FIG. 11 is a diagrammatic hybrid schematic and sectional structural view of circuitry incorporating a nonvolatile memory cell in accordance with an embodiment of the invention.

FIG. 11 is an example schematic diagram of additional circuitry which might be fabricated to constitute a portion of cross points of memory array 52 of FIG. 10. Such comprises an example semiconductor transistor 62 electrically coupled with non-volatile memory cell 50 via a current conducting element 64. Semiconductor transistor 62 includes a semiconductor substrate 61 having doped regions (e.g., illustrated as n-doped regions) and a channel region (e.g., illustrated as a p-doped channel region) between the n-doped regions. Transistor 62 includes a gate 66 which is current coupled to a word line WL to allow selection and current to flow from a bit line BL to a second metal contact 68. Accordingly, one of the first and second electrodes of memory cell 50 would be electrically coupled for current flow with metal contact 68, with the other of such electrodes being electrically coupled for current flow to electrically conducting element 64. Other embodiments, whether existing or yet-to-be-developed, are also of course contemplated.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A nonvolatile memory cell comprising:
a first electrode, a second electrode, and a programmable region between the first and second electrodes;
the first electrode comprising a first current conductive material and a second current conductive material different in composition from the first current conductive material, the first and second current conductive materials being within an opening in a dielectric material, all of the second current conductive material being within the opening in the dielectric material, the second current conductive material having a first portion laterally surrounded by the first current conductive material and a second portion projecting elevationally outward from the first current conductive material and from the first portion, the second portion having vertical sidewalls all of which are within the opening in the dielectric material and having a top surface, the programmable region being directly against the top surface and directly against the vertical sidewalls of the second portion of the projecting second current conductive material; and the second portion of second current conductive material comprising a neck projecting elevationally outward from the first portion, the first portion comprising a pair of second conductive material shoulders that are laterally inward of the first current conductive material.

2. The memory cell of claim 1 wherein the programmable region comprises ion conductive material, and at least one of the first and second electrodes has an electrochemically active surface directly against the ion conductive material.

3. The memory cell of claim 1 wherein the second current conductive material shoulders have elevationally outermost surfaces that are planar.

4. The memory cell of claim 3 wherein the elevationally outermost surfaces of the second current conductive material shoulders are coplanar.

5. The memory cell of claim 4 wherein the elevationally outermost surfaces of the first current conductive material are planar and are coplanar with the elevationally outermost surfaces of the second current conductive material shoulders.

6. The memory cell of claim 1 wherein the second current conductive material is recessed within the elevational thickness of the dielectric material in which the opening is received.

7. A nonvolatile memory cell comprising:
a first electrode, a second electrode, and a programmable region between the first and second electrodes; and
the first electrode comprising a first current conductive material and a second current conductive material different in composition from the first current conductive material, the first and second current conductive materials being within an opening in a dielectric material, all of the second current conductive material being within the opening in the dielectric material, the second current conductive material having a first portion and a second portion projecting elevationally outward from the first current conductive material and from the first portion, the second portion being narrower than the first portion and having vertical sidewalls all of which are within the opening in the dielectric material and having a top surface, a top surface of the first portion of the second current conductive material being coplanar with a top surface of the first current conductive material, the programmable region being directly against the top surface of the second portion and directly against the vertical sidewalls of the second portion of the second current conductive material.

8. The memory cell of claim 7 wherein the second portion of second current conductive material comprises a neck projecting elevationally outward from the first portion, the first portion comprising a pair of second conductive material shoulders that are laterally inward of the first current conductive material.

9. The memory cell of claim 7 wherein the programmable region comprises ion conductive material, and at least one of the first and second electrodes has an electrochemically active surface directly against the ion conductive material.

10. The memory cell of claim 7 wherein the second current conductive material is recessed within the elevational thickness of the dielectric material in which the opening is received.

\* \* \* \* \*